United States Patent [19]
Durand et al.

[11] Patent Number: 5,183,593
[45] Date of Patent: Feb. 2, 1993

[54] ELECTRICALLY CONDUCTIVE CEMENT

[75] Inventors: David Durand, Providence; David P. Vieau, East Greenwich; Tai S. Wei, Warwick; Ang-Ling Chu, Cranston, all of R.I.

[73] Assignee: Poly-Flex Circuits, Inc., Cranston, R.I.

[21] Appl. No.: 533,682

[22] Filed: Jun. 4, 1990

Related U.S. Application Data

[63] Continuation-in-part of Ser. No. 436,199, Nov. 14, 1989.

[51] Int. Cl.$^5$ .............................................. H01B 1/02
[52] U.S. Cl. .................................. 252/514; 252/512; 252/511
[58] Field of Search ................... 252/512, 514, 511

[56] References Cited

U.S. PATENT DOCUMENTS

| | | | |
|---|---|---|---|
| 4,113,981 | 9/1978 | Fujita et al. | 252/514 |
| 4,210,704 | 7/1980 | Chandross et al. | 252/514 |
| 4,410,457 | 10/1983 | Fujimura et al. | 252/508 |
| 4,487,811 | 12/1984 | Eichelberger et al. | 428/546 |
| 4,568,592 | 2/1986 | Kawaguchi et al. | 428/107 |
| 4,595,606 | 6/1986 | St. John et al. | 252/514 |
| 4,729,809 | 3/1988 | Dery et al. | 156/306.6 |
| 5,006,575 | 4/1991 | Chan | 523/458 |
| 5,045,141 | 9/1991 | Salensky et al. | 252/514 |
| 5,087,314 | 2/1992 | Sandborn et al. | 156/330 |

FOREIGN PATENT DOCUMENTS

| | | |
|---|---|---|
| 3217723A1 | 12/1982 | Fed. Rep. of Germany . |
| 62-061336 | 3/1987 | Japan . |
| 63-162758 | 7/1988 | Japan . |
| 2089126 | 12/1981 | United Kingdom . |

*Primary Examiner*—Karl Group
*Assistant Examiner*—Chris Gallo
*Attorney, Agent, or Firm*—Kenyon & Kenyon

[57] ABSTRACT

An electrically conductive cement which when used to bond electrically conductive mating surfaces provides substantially stable conductivity characteristics under high humidity conditions; comprised of a carrier that provides a volumetric shrinkage of more than about 6.8% (vol.) and a conductive filler including agglomerates, particles, powders, flakes, coated nickel particles, and coated glass spheres, having size and surface characteristics that maintain stable electrical contact by forming a moisture resistant contact with an electrical component lead. The carrier having a volumetric shrinkage between the uncured and cured states of greater than about 6.8% (vol) appears to effect a compaction of the filler particles causing the particles to be forced into enhanced electrical contact with the surfaces to be connected and to provide a measure of compaction between the particles themselves to enhance particle-to-particle conduction. The shrinkage of the polymeric carrier during curing places the interior particles under compression with sufficient force to urge the particles into engagement with one another as well as to cause the particles to penetrate non-conductive oxides that may be present on a component lead.

21 Claims, 14 Drawing Sheets

| | INITIAL @ RM TEMP | INITIAL @ 60°C/90% RH | % INCR | 15 HR 60°C/90% RH | % INCR | 24 HR @ 60°C/90% RH | % INCR | 39 HR @ 60°C/90% RH | % INCR | 63 HR @ 60°C/90% RH | % INCR | 111 60°C/90% RH | % INCR | EX 1 R 1000 |
|---|---|---|---|---|---|---|---|---|---|---|---|---|---|---|
| CHIP | 5:00 PM | 5:30 PM | | 9:00 AM | | 5:00 PM | | 9:00 AM | | 9:00 AM | | 10:00 AM | | |
| HEIGHT | | | | | | | | | | | | | | 1000.000 |
| 68 | 12.435 | 13.159 | 15.7 | 15.546 | 18.3 | 15.914 | 22.1 | 16.269 | 25.7 | 16.128 | 30.4 | 15.296 | 33.9 | 34.648 |
| 140°C/10m/IR res | 25.669 | 26.238 | 34.1 | 26.302 | 2.9 | 26.294 | 2.5 | 26.287 | 2.2 | 26.29 | 2.3 | 25.97 | 18.00 | 26.407 |
| 44 | 7.367 | 8.217 | 19.5 | 10.116 | 36.4 | 10.214 | 38.3 | 10.324 | 40.4 | 10.401 | 41.9 | 9.442 | 47.5 | 13.407 |
| 68 | | | | | | | | | 36.6 | | | | | |
| 140°C/10m/IR res | 6.961 | 7.657 | 17.6 | 9.126 | 31.5 | 9.276 | 34.8 | 9.362 | 36.6 | 9.473 | 39.00 | 8.6611 | 42.9 | 13.801 |
| 44 | | | | | | | | | | | | | | 132.1 |

FIG. 1

| ACETONE CLEANED | | | INITIAL @ RM TEMP. 4:30 PM | INITIAL @ 60°C/90% RH 5:00 PM | % INCR | 17 HR @ 60°C/90% RH 10/26/89 10:00 AM | % INCR | 40 HR @ 60°C/90% RH 10:00 AM | % INCR | 112 HR @ 60°C/90% RH 10:00 AM | % INCR | 306 HR @ 60°C/90% RH 12:30 PM | % INCR | 618 HR @ 60°C/90% RH | % INCR |
|---|---|---|---|---|---|---|---|---|---|---|---|---|---|---|---|
| | CHIP | HEIGHT | | | | | | | | | | | | | |
| | 68 | 9.0 | 11.41 | 12.35 | 12.1 | 12.12 | 0.4 | 12.23 | 1.4 | 12.21 | -1.7 | 12.12 | -2.8 | 12.10 | 3.0 |
| 140°C/10 MIN res | | | 1.42 | 1.54 | 9.1 | 1.56 | 1.4 | 1.48 | 4.2 | 1.46 | -5.6 | 1.46 | -5.6 | 1.46 | -5.6 |
| | 44 | 3.0 | 7.22 | 7.76 | 12.8 | 7.10 | 1.9 | 7.52 | 5.0 | 7.46 | -6.3 | 7.43 | -6.9 | 7.42 | -7.1 |
| | 68 | 3.0 | 13.48 | 14.52 | 11.0 | 14.64 | 1.1 | 14.64 | 1.1 | 14.64 | 1.1 | 14.49 | -0.3 | 14.59 | 0.1 |
| 140°C/10 MIN res | | | 1.30 | 1.40 | 8.3 | 1.44 | 3.1 | 1.43 | 2.3 | 1.42 | 1.5 | 1.42 | 1.5 | 1.43 | 2.3 |
| | 44 | 4.0 | 7.66 | 8.28 | 13.3 | 8.30 | 0.4 | 8.38 | 1.9 | 8.41 | 2.5 | 6.30 | 0.4 | 8.34 | 1.1 |
| | 68 | 5.5 | 10.37 | 11.26 | 14.3 | 11.12 | 2.2 | 11.14 | 1.9 | 11.16 | -1.6 | 11.22 | -0.8 | 11.15 | -1.8 |
| 140°C/10 MIN res | | | 1.37 | 1.49 | 9.4 | 1.55 | 4.3 | 1.50 | 0.7 | 1.51 | 1.4 | 1.52 | 2.2 | 1.50 | 0.7 |
| | 44 | 2.8 | 6.34 | 6.88 | 16.2 | 6.75 | 3.4 | 6.75 | 3.4 | 6.76 | -3.1 | 6.74 | 3.6 | 6.67 | 5.4 |
| | 68 | 2.5 | 11.52 | 10.79 | 12.9 | 12.64 | 1.8 | 12.68 | 2.2 | 12.72 | 2.7 | 12.67 | 2.1 | 12.79 | 3.5 |
| 140°C/10 MIN res | | | 1.41 | 1.53 | 9.2 | 1.55 | 1.4 | 1.53 | 0.0 | 1.54 | 0.7 | 1.52 | -0.7 | 1.51 | -1.4 |
| | 44 | 3.3 | 7.63 | 6.26 | 13.6 | 8.35 | 1.7 | 8.38 | 2.3 | 8.41 | 2.9 | 6.35 | 1.7 | 6.34 | 1.5 |
| | 68 | 3.0 | 10.11 | 10.79 | 11.1 | 10.79 | 0.0 | 10.76 | 0.4 | 10.75 | -0.6 | 10.70 | -1.3 | 10.66 | -1.9 |
| 140°C/10 MIN res | | | 1.40 | 1.52 | 9.2 | 1.57 | 3.5 | 1.60 | 5.6 | 1.61 | 6.3 | 1.62 | 7.0 | 1.65 | 9.2 |
| | 44 | 2.0 | 6.30 | 6.87 | 17.3 | 6.82 | 1.2 | 6.79 | 2.1 | 6.78 | -2.3 | 6.71 | -4.1 | 6.68 | -4.9 |
| | 68 | 5.5 | 9.95 | 10.85 | 15.1 | 10.84 | 0.1 | 10.77 | 1.2 | 10.76 | -1.3 | 10.71 | -2.0 | 10.61 | -3.5 |
| 140°C/10 MIN res | | | 1.38 | 1.50 | 9.4 | 1.53 | 2.1 | 1.54 | 2.9 | 1.54 | 2.9 | 1.54 | 2.9 | 1.55 | 3.6 |
| | 44 | 2.0 | 6.09 | 6.63 | 17.5 | 6.58 | 1.4 | 6.61 | 0.6 | 6.62 | -0.3 | 6.64 | 0.3 | 6.52 | 3.0 |

FIG. 3A
SHEET 1/2

| 1002 HR @ 60°C/90% RH | % INCR | 60 |
|---|---|---|
| | | |
| 12.15 | 2.4 | |
| 1.41 | -9.0 | |
| 7.41 | -7.4 | |
| | | |
| 14.82 | 2.9 | |
| 1.47 | 5.4 | |
| 6.41 | 2.5 | |
| | | |
| 11.34 | 0.8 | |
| 1.54 | 3.6 | |
| 6.70 | 4.6 | |
| | | |
| 13.00 | 6.0 | |
| 1.51 | -1.4 | |
| 8.42 | 3.0 | |
| | | |
| 10.77 | 0.3 | |
| 1.68 | 11.3 | |
| 6.68 | -4.9 | |
| | | |
| 10.65 | -2.9 | |
| 1.56 | 4.3 | |
| 6.61 | 0.6 | |

FIG. 3A
SHEET 2/2

| INORGANIC ACID | | CHIP HEIGHT | INITIAL @ RM TEMP 5:00 PM | INITIAL @ 60 C/90% RH 6:00 PM | % INCR | 14.5 HR @ 60 C/90% RH 8:30 AM | % INCR | 117.5 HR @ 60 C/90% RH 4:30 PM | % INCR | 149 HR @ 60 C/90% RH 11:00 AM |
|---|---|---|---|---|---|---|---|---|---|---|
| | 68 | 4 | 10.440 | 11.240 | 12.4 | 11.120 | 1.7 | 11.030 | -2.9 | 11.030 |
| 140 C/10 MIN res | 44 | 2 | 5.950 | 6.400 | 15.3 | 6.350 | -1.5 | 6.310 | -2.6 | 6.310 |
| | 68 | 3 | 9.030 | 9.780 | 14.9 | 9.720 | -1.0 | 9.670 | -1.9 | 9.670 |
| 140 C/10 MIN res | | | 25.180 | 25.510 | 13.5 | 25.550 | 2.6 | 25.540 | 2.0 | 25.540 |
| | 44 | 1.3 | 6.630 | 7.150 | 14.3 | 7.100 | -1.2 | 7.070 | -1.9 | 7.070 |
| | 68 | 2.8 | 10.650 | 11.550 | 13.5 | 11.530 | -0.3 | 11.700 | -1.1 | 11.470 |
| 140 C/10 MIN res | 44 | 1.8 | 7.040 | 7.620 | 14.4 | 4.610 | -0.2 | 7.570 | -1.1 | 7.570 |
| | 68 | 2.5 | 9.720 | 10.560 | 14.7 | 10.530 | -0.5 | 10.500 | -0.9 | 10.500 |
| 140 C/10 MIN res | | | 25.310 | 25.390 | 15.9 | 25.390 | 6.1 | 25.390 | 6.1 | 25.390 |
| | 44 | 2.8 | 5.680 | 6.160 | 17.9 | 6.120 | -1.3 | 6.080 | -2.5 | 6.080 |
| | 68 | 2 | | | | | | | | |
| 140 C/10 MIN res | 44 | 0.5 | | | | | | | | |
| | 68 | 3 | 10.230 | 11.040 | 13.0 | 10.980 | -0.9 | 10.910 | -1.8 | 10.910 |
| 140 C/10 MIN res | | | 25.180 | 25.370 | 16.1 | 25.390 | 1.5 | 25.390 | 1.5 | 25.390 |
| | 44 | 2.5 | 7.340 | 7.900 | 12.9 | 7.850 | -1.0 | 7.800 | -2.0 | 7.800 |

FIG. 3B SHEET 1/2

| % INCR | 297 HR @ 60 C/90% RH | % INCR | 969 HR @ 60 C/90% RH | % INCR |
|---|---|---|---|---|
| | 3:00 PM | | 2:30 PM | |
| -2.9 | 10.96 | -3.9 | 10.86 | -5.2 |
| -2.6 | 6.27 | -3.8 | 6.25 | -4.4 |
| -1.9 | 9.6 | -3.1 | 9.53 | -4.3 |
| 2.0 | 25.52 | 0.7 | 25.56 | 3.3 |
| -1.9 | 7.04 | -2.7 | 6.98 | -4.1 |
| -1.1 | 11.45 | -1.3 | 11.44 | -1.5 |
| -1.1 | 7.55 | -1.5 | 4.47 | -3.2 |
| -0.9 | 10.45 | -1.7 | 10.41 | -2.3 |
| 6.1 | 25.4 | 6.9 | 25.47 | 12.2 |
| -2.5 | 6.04 | -3.8 | 5.96 | -6.3 |
| | | | | |
| | | | | |
| -1.8 | 10.88 | -2.3 | 10.89 | 2.1 |
| 1.5 | 25.38 | 0.7 | 25.34 | 2.2 |
| -2.0 | 7.79 | -2.2 | 7.86 | 0.8 |

FIG. 3B
SHEET 2/2

| 4.5% | | | INITIAL @ RM TEMP. | INITIAL @ 60°C/90% RH | % INCR | 15 HR @ 60°C/90% RH | % INCR | 65 HR @ 60°C/90% RH | % INCR | 141 HR @ 60°C/90% RH | % INCR |
|---|---|---|---|---|---|---|---|---|---|---|---|
| | | CHIP HEIGHT | 5:00 PM | 5:30 PM | | 8:30 PM | | 10:00 AM | | 2:00 PM | |
| 140°C/10 MIN res | 68 | 4.0 | 10.45 | 11.40 | 14.7 | 11.34 | -0.8 | 11.32 | -1.1 | 11.350 | 0.7 |
| | | | 1.66 | 1.80 | 9.0 | 1.83 | 1.7 | 1.84 | 2.2 | 1.840 | 2.2 |
| | 44 | 1.0 | 6.47 | 7.03 | 16.1 | 7.04 | 0.2 | 7.04 | 0.2 | 7.060 | 0.7 |
| 140°C/10 MIN res | 68 | 2.8 | 9.63 | 10.40 | 15.1 | 10.41 | -1.1 | 10.4 | -1.2 | 10.420 | 0.9 |
| | | | 1.38 | 1.50 | 9.4 | 1.53 | 2.0 | 1.53 | 2.0 | 1.540 | 2.7 |
| | 44 | 0.5 | 5.51 | 6.01 | 19.9 | 5.99 | -0.7 | 5.98 | -1.0 | 5.990 | -0.7 |

| STEAMED 8 HRS | | | INITIAL @ RM TEMP | INITIAL @ 60°C/90% RH | % INCR | 62 HR 60°C/90% RH | % INCR | 136 HR 60°C/90% RH | % INCR | 1073 HR 60°C/90% RH | % INCR | 1598 HR 60°C/90% RH | % INCR |
|---|---|---|---|---|---|---|---|---|---|---|---|---|---|
| | | CHIP | 5:30 PM | 6:00 PM | | 8:00 AM | | 10:00 AM | | 11:00 AM | | 8:00 AM | |
| | | HEIGHT | | | | | | | | | | | |
| | | 68 | 32,170 | 34,060 | 6.7 | 32,210 | 6.2 | 31,270 | 9.3 | 31,400 | 8.8 | 31,890 | 7.2 |
| 140°C/10 MIN | res | | 1,940 | 2,090 | 8.2 | 2,210 | 6.0 | 2,200 | 5.5 | 2,250 | 1.9 | 2,280 | 3.8 |
| | | 44 | 18,910 | 20,100 | 7.5 | 19,020 | 6.3 | 18,680 | 8.3 | 19,020 | 6.3 | 19,310 | 4.6 |
| | | 68 | 36,570 | 38,630 | 6.3 | 35,640 | 8.6 | 34,600 | 11.6 | 34,390 | 12.2 | 34,960 | 10.6 |
| 140°C/10 MIN | res | | 2,100 | 2,250 | 7.5 | 2,370 | 5.6 | 2,410 | 7.4 | 2,620 | 11.0 | 2,670 | 11.3 |
| | | 44 | 21,580 | 50,320 | 154.7 | | | | | | | | |
| | | 68 | 68,290 | 71,430 | 4.9 | 66,810 | 6.9 | 63,200 | 12.2 | 63,240 | 12.1 | 64,680 | 10.0 |
| 140°C/10 MIN | res | | 2,040 | 2,180 | 7.2 | 2,490 | 14.9 | 2,500 | 15.4 | 2,660 | 7.1 | 2,740 | 10.0 |
| | | 44 | 31,880 | 33,430 | 5.4 | 31,460 | 6.5 | 30,710 | 8.9 | 31,740 | 5.6 | 32,480 | 3.1 |
| | | 68 | 52,940 | 55,370 | 5.0 | 55,720 | 0.7 | 51,230 | 8.1 | 51,270 | 8.6 | 52,680 | 3.1 |
| 140°C/10 MIN | res | | | | | | | | | | | | |
| | | 44 | 26,140 | 27,490 | 5.8 | 25,850 | 6.7 | 25,300 | 8.9 | 25,880 | 6.6 | 26,710 | 3.2 |
| | | 68 | 28,440 | 30,060 | 6.6 | 28,500 | 6.0 | 27,630 | 9.3 | 27,650 | 9.2 | 28,300 | 6.8 |
| 140°C/10 MIN | res | | 1,980 | 2,100 | 6.4 | 2,190 | 4.5 | 2,210 | 5.5 | 2,570 | 18.2 | 2,610 | 19.0 |
| | | 44 | 15,980 | 16,060 | 0.6 | | | 16,050 | 0.1 | 16,410 | 2.7 | 16,720 | 5.1 |
| | | 68 | 30,220 | 31,850 | 6.2 | 29,920 | 6.9 | 29,060 | 10 | 29,600 | 8.1 | 30,890 | 3.4 |
| 140°C/10 MIN | res | | 1,880 | 2,020 | 7.9 | 2,080 | 3.1 | 2,050 | 1.6 | 2,140 | 3.0 | 2,190 | 7.2 |
| | | 44 | 19,040 | 20,150 | 6.9 | 19,150 | 5.8 | 18,840 | 7.6 | 19,380 | 4.5 | 20,020 | 0.8 |

FIG. 6

| | | INITIAL @ RM TEMP 7:00 PM | INITIAL @ 60°C/90% R 7:30 PM | % INCR | 14 HR 60°C/90% R 1:30 PM | % INCR | 62 HR 60°C/90% R 8:30 AM | % INCR | 1025 HR 60°C/90% RH 8:30 AM | % INCR | 1530 HR 60°C/90% RH 1:30 PM | % INCR |
|---|---|---|---|---|---|---|---|---|---|---|---|---|
| | CHIP HEIGHT | | | | | | | | | | | |
| | 68 | 7.770 | 8.460 | 18.3 | 8.430 | -0.7 | 8.420 | -0.9 | 8.300 | -3.6 | 8.210 | -5.6 |
| 140°C/10 MIN res | | 1.700 | 1.840 | 8.8 | 1.820 | -1.1 | 1.820 | -1.1 | 1.720 | -5.6 | 1.660 | -9.3 |
| | 44 | 4.740 | 5.170 | 24.7 | 5.120 | -2.3 | 5.110 | -2.8 | 5.010 | -7.4 | 5.000 | -7.8 |
| | 68 | 6.350 | 6.910 | 23.8 | 6.880 | -1.0 | 6.870 | -1.4 | 6.610 | -10.3 | 6.570 | -11.7 |
| 140°C/10 MIN res | | 1.500 | 1.610 | 7.9 | 1.600 | -0.7 | 1.600 | -0.7 | 1.550 | -3.3 | 1.510 | -6.0 |
| | 44 | 4.630 | 5.040 | 25.2 | 5.010 | -1.5 | 5.010 | -1.5 | 4.980 | -2.9 | 5.050 | 0.5 |
| | 68 | 6.580 | 7.180 | 23.3 | 7.170 | -0.3 | 7.170 | -0.3 | 7.040 | -4.4 | 7.100 | 2.5 |
| 140°C/10 MIN res | | 1.530 | 1.660 | 9.1 | 1.650 | -0.6 | 1.650 | -0.6 | 1.590 | -3.9 | 1.550 | 6.5 |
| | 44 | 4.550 | 4.980 | 27.7 | 4.970 | -0.5 | 4.970 | -0.5 | 5.050 | 3.5 | 5.190 | 10.6 |
| | 68 | 7.500 | 8.160 | 18.9 | 8.100 | -1.4 | 8.080 | -1.9 | 7.920 | -4.4 | 7.870 | -5.1 |
| 140°C/10 MIN res | | 1.760 | 1.910 | 9.3 | 1.890 | -1.1 | 1.930 | 1.1 | 1.810 | -4.5 | 2.040 | 6.0 |
| | 44 | 4.810 | 5.250 | 24.3 | 5.200 | -2.2 | 5.190 | -2.7 | 5.070 | -8.0 | 5.010 | -10.7 |
| | 68 | 7.100 | 8.500 | 45.2 | 8.520 | 0.4 | 8.530 | 0.7 | 8.540 | 0.9 | 8.720 | 4.9 |
| 140°C/10 MIN res | | 1.630 | 1.760 | 8.5 | 1.760 | 0.0 | 1.800 | 2.4 | 1.650 | -6.6 | 1.620 | -10.6 |
| | 44 | | | | | | | | | | | |
| | 68 | | | | | | | | | | | |
| 140°C/10 MIN res | | 1.550 | 1.68. | 9.0 | 1.670 | -0.6 | 1.670 | -0.6 | 1.660 | -0.6 | 1.760 | 5.7 |
| | 44 | 4.250 | 4.640 | 31.2 | 4.600 | -2.4 | 4.600 | -2.4 | 4.520 | -7.3 | 4.510 | 7.9 |

FIG. 7

| IPA CLEANED | | CHIP HEIGHT | INITIAL @ RM TEMP. 6:00 PM | INITIAL @ 60°C/90% RH 6:30 PM | % INCR | 14 HR 60°C/90% RH 8:30 AM | % INCR | 62 HR 60°C/90% RH 8:30 AM | % INCR | 1025 HR 60°C/90% RH 11:00 AM | % INCR |
|---|---|---|---|---|---|---|---|---|---|---|---|
| | | 68 | 7.710 | 8.310 | 16.2 | 8.220 | -2.1 | 8.090 | -5.1 | 7.850 | -10.7 |
| 140°C/10 MIN | res | | 1.540 | 1.640 | 6.9 | 1.620 | -1.3 | 1.610 | -1.9 | 1.630 | 0.7 |
| | | 44 | 4.930 | 5.310 | 19.7 | 5.240 | -3.0 | 5.150 | -6.9 | 4.970 | -14.7 |
| | | 68 | 7.470 | 8.120 | 18.7 | 8.090 | -0.7 | 8.010 | -2.7 | 7.820 | -7.3 |
| 140°C/10 MIN | res | | 1.500 | 1.610 | 7.9 | 1.600 | -0.7 | 1.590 | -1.3 | 1.590 | -0.7 |
| | | 44 | | | | | | | | | |
| | | 68 | 7.890 | 8.600 | 18.3 | 8.570 | -0.7 | 8.460 | -3.0 | 8.260 | -7.4 |
| 140°C/10 MIN | res | | 1.580 | 1.690 | 7.4 | 1.670 | -1.3 | 1.660 | -1.9 | 1.670 | 0.0 |
| | | 44 | 5.080 | 5.530 | 21.6 | 5.500 | -1.2 | 5.430 | -4.0 | 5.310 | -8.7 |
| | | 68 | 7.340 | 8.000 | 19.8 | 7.960 | -1.0 | 7.860 | -3.5 | 7.810 | -3.8 |
| 140°C/10 MIN | res | | 1.400 | 1.470 | 5.4 | 1.420 | -3.6 | 1.410 | -4.4 | 1.430 | 0.8 |
| | | 44 | 4.560 | 4.980 | 26.9 | 4.960 | -1.0 | 4.910 | -3.5 | 4.830 | -7.6 |
| | | 68 | 7.700 | 8.390 | 18.6 | 8.360 | -0.7 | 8.260 | -3.0 | 8.170 | -5.0 |
| 140°C/10 MIN | res | | 1.500 | 1.610 | 7.9 | 1.600 | -0.7 | 1.580 | -2.0 | 1.610 | 0.7 |
| | | 44 | 8.440 | 5.090 | 61.6 | 5.080 | -0.5 | 5.030 | -2.9 | 4.970 | -5.7 |
| | | 68 | 7.740 | 8.390 | 17.4 | 8.300 | -2.1 | 8.150 | -5.5 | 8.160 | -5.2 |
| 140°C/10 MIN | res | | 1.550 | 1.660 | 7.6 | 1.650 | -0.6 | 1.640 | -1.3 | 1.690 | 2.6 |
| | | 44 | 4.800 | 5.250 | 25.0 | 5.230 | -0.9 | 5.140 | -4.9 | 5.060 | -8.4 |

FIG. 8

| IPA CLEANED | | CHIP HEIGHT | INITIAL @ RM TEMP | INITIAL @ 60°C/90% RH | % INCR | 1.5 HR 60°C/90% RH | % INCR | 19.1 HR 60°C/90% RH | % INCR | 98.1 HR 60°C/90% RH | % INCR |
|---|---|---|---|---|---|---|---|---|---|---|---|
| | | | 5:00 PM | 5:30 PM | | 8:30 AM | | 4:00 PM | | 2:00 PM | |
| 140°C/10 MIN res | 68 | | 1.480 | 1.560 | 5.800 | 1.540 | -1.400 | 1.410 | -10.300 | 1.480 | -4.2 |
| | 44 | | 4.320 | 4.660 | 25.800 | 4.640 | -1.200 | 4.360 | -18.100 | 4.770 | 6.6 |
| | 68 | | 6.830 | 7.330 | 17.700 | 7.170 | -4.800 | 6.720 | -18.300 | 7.110 | -6.6 |
| 140°C/10 MIN res | | | 1.480 | 1.560 | 5.800 | 1.550 | -0.700 | 1.420 | -9.600 | 1.500 | -3.4 |
| | 44 | | 4.340 | 4.700 | 26.900 | 4.670 | -1.800 | 4.420 | -16.500 | 4.760 | 3.5 |
| | 68 | | 6.920 | 7.520 | 20.500 | 7.450 | -2.000 | 7.030 | -13.900 | 7.520 | 0.0 |
| 140°C/10 MIN res | | | 1.440 | 1.520 | 6.000 | 1.510 | -0.700 | 1.370 | -10.600 | 1.430 | 5.7 |
| | 44 | | 4.270 | 4.640 | 29.100 | 4.620 | -1.200 | 4.390 | -15.200 | 4.780 | 8.5 |
| | 68 | | | | | | | | | | |
| 140°C/10 MIN res | | | 1.470 | 1.550 | 5.800 | 1.530 | -1.400 | 1.420 | -9.000 | 1.490 | -2.8 |
| | 44 | | 4.200 | 4.560 | 30.000 | 4.520 | -2.600 | 4.250 | -19.900 | 4.470 | -5.8 |
| | 68 | | 7.050 | 7.670 | 20.300 | 7.600 | -1.900 | 7.460 | -5.700 | 7.470 | -5.4 |
| 140°C/10 MIN res | | | 1.470 | 1.550 | 5.800 | 1.550 | -0.000 | 1.430 | -8.300 | 1.520 | -2.1 |
| | 44 | | 4.320 | 4.700 | 28.800 | 4.660 | -2.400 | 4.360 | -20.000 | 4.650 | -2.9 |
| | 68 | | | | | | | | | | |
| 140°C/10 MIN res | | | 1.470 | 1.540 | 5.100 | 1.510 | -2.100 | 1.400 | -9.700 | 1.530 | 1.4 |
| | 44 | | 4.230 | 4.580 | 28.500 | 4.540 | -2.500 | 4.200 | -24.100 | 4.450 | -8.2 |

FIG. 9

| IPA CLEANED | | INITIAL @ RM TEMP 2:00 PM | INITIAL @ 60°C/90%R 2:30 PM | % INCR | 119HR 60°C/90%R 1:00 PM | % INCR | 503 HR 60°C/90%R 1:00 PM | % INCR | 1146 HR 60°C/90%R 8:00 AM | % INCR |
|---|---|---|---|---|---|---|---|---|---|---|
| | CHIP HEIGHT | | | | | | | | | |
| | 68 | 11.40 | 12.17 | 10.00 | 11.92 | 3.10 | 12.02 | 1.80 | 12.32 | 1.80 |
| 140°C/10 MIN res | | 1.49 | 1.58 | 6.50 | 1.50 | 5.40 | 1.48 | 6.80 | 1.47 | 7.40 |
| | 44 | 0.00 | 0.00 | | | | | | | |
| | 68 | 10.01 | 10.81 | 13.30 | 10.65 | 2.30 | 10.73 | 1.20 | 11.43 | 9.10 |
| 140°C/10 MIN res | | 1.56 | 1.66 | 6.80 | 1.62 | 2.60 | 1.62 | 2.60 | 1.63 | 1.90 |
| | 44 | 6.74 | 7.27 | 14.00 | 7.14 | 3.00 | 7.21 | 1.40 | 7.35 | 1.90 |
| | 68 | 9.49 | 10.27 | 14.20 | 10.11 | 2.60 | 10.19 | 1.30 | 10.37 | 1.60 |
| 140°C/10 MIN res | | 1.50 | 1.58 | 5.70 | 1.49 | 6.10 | 1.43 | 10.10 | 1.43 | 10.10 |
| | 44 | 6.42 | 6.92 | 14.60 | 6.78 | 3.60 | 6.85 | 1.80 | 6.99 | 1.80 |
| | 68 | 1.38 | 1.47 | 7.00 | 1.43 | 2.90 | 1.41 | 4.40 | 1.41 | 4.40 |
| 140°C/10 MIN res | | 5.57 | 6.03 | 17.90 | 5.95 | 2.60 | 6.03 | 0.00 | 6.17 | 4.60 |
| | 44 | | | | | | | | | |
| | 68 | 11.76 | 12.64 | 11.30 | 12.64 | 0.00 | 12.82 | 2.10 | 13.18 | 6.20 |
| 140°C/10 MIN res | | 1.40 | 1.49 | 6.90 | 1.45 | 2.90 | 1.44 | 3.60 | 1.43 | 4.30 |
| | 44 | 9.39 | 7.75 | 25.70 | 7.87 | 2.50 | 7.94 | 4.00 | 8.50 | 15.80 |
| | 68 | 11.14 | 11.93 | 11.10 | 11.98 | 0.60 | 12.16 | 2.90 | 12.51 | 7.30 |
| 140°C/10 MIN res | | 1.58 | 1.66 | 5.40 | 1.57 | 5.80 | 1.55 | 7.10 | 1.53 | 8.30 |
| | 44 | 9.14 | 9.74 | 9.80 | 9.59 | 2.20 | 9.75 | 0.10 | 10.08 | 5.00 |

| IPA CLEANED | | INITIAL @ RM TEMP | INITIAL @ 60 C/90% RH | % INCR | 65 HR 60 C/90% RH | % INCR | 453 HR 60 C/90% RH | % INCR | 1096 HR 60 C/90% RH | % INCR |
|---|---|---|---|---|---|---|---|---|---|---|
| | CHIP HEIGHT | 4:00 PM | 4:30 PM | | 9:00 AM | | 1:00 PM | | 8:00 AM | |
| 140 C/10 MIN | 68 | 1.490 | 1.610 | 8.6 | 1.590 | -1.3 | 1.550 | -4.0 | 1.540 | -4.6 |
| res | 44 | 8.690 | 9.410 | 12.7 | 9.530 | 1.9 | 9.690 | 4.4 | 10.330 | 14.4 |
| | 68 | 15.460 | 16.690 | 10.7 | 16.630 | -0.5 | 16.610 | -0.6 | 17.120 | 3.4 |
| 140 C/10 MIN | res | 1.450 | 1.560 | 8.1 | 1.530 | -2.1 | 1.490 | -4.8 | 1.490 | -4.8 |
| | 44 | 11.770 | 12.650 | 10.0 | 12.600 | -0.5 | 12.710 | 0.6 | 13.230 | 6.0 |
| | 68 | 11.890 | 12.920 | 13.1 | 13.020 | 1.1 | 13.100 | 2.0 | 13.550 | 7.1 |
| 140 C/10 MIN | res | 1.570 | 1.700 | 8.8 | 1.670 | -1.9 | 1.640 | -3.8 | 1.630 | -4.4 |
| | 44 | 7.860 | 8.550 | 14.2 | 8.560 | 0.2 | 8.680 | 2.3 | 9.210 | 11.9 |
| | 68 | 16.270 | 17.550 | 10.4 | 17.520 | -0.2 | 17.460 | -0.7 | 17.910 | 2.7 |
| 140 C/10 MIN | res | 1.490 | 1.600 | 7.9 | 1.570 | -2.0 | 1.530 | -4.7 | 1.530 | -4.7 |
| | 44 | 11.500 | 12.400 | 10.6 | 12.250 | -1.6 | 12.220 | -1.9 | 12.600 | 2.1 |
| | 68 | 11.090 | 12.060 | 13.7 | 11.980 | -1.0 | 11.890 | -2.1 | 11.980 | -1.0 |
| 140 C/10 MIN | res | 1.440 | 1.560 | 9.0 | 1.520 | -2.7 | 1.470 | -6.2 | 1.470 | -6.2 |
| | 44 | 7.150 | 7.770 | 14.9 | 7.660 | -2.3 | 7.620 | 3.1 | 7.810 | 0.8 |
| | 68 | 10.960 | 11.930 | 13.9 | 11.890 | -0.5 | 11.860 | -0.9 | 12.030 | 1.3 |
| 140 C/10 MIN | res | 1.410 | 1.530 | 9.2 | 1.510 | -1.4 | 1.490 | -2.8 | 1.480 | -3.5 |
| | 44 | 8.290 | 9.000 | 13.4 | 8.970 | -0.5 | 9.080 | 1.3 | 9.500 | 8.3 |

| IPA CLEANED | | CHIP HEIGHT | INITIAL @ RM TEMP. 4:00 PM | INITIAL @ 60°C/90% RH 4:30 PM | % INCR | 65 HR 60°C/90% RH 9:30 AM | % INCR | 453 HR 60°C/90% RH 1:00 PM | % INCR | 1096 HR 60°C/90% RH 8:00 AM | % INCR |
|---|---|---|---|---|---|---|---|---|---|---|---|
| | | 68 | 13.720 | 14.850 | 11.6 | 14.800 | -0.5 | 15.030 | 1.7 | 15.830 | 9.0 |
| 140°C/10 MIN | res | | 1.520 | 1.650 | 9.2 | 1.680 | 1.9 | 1.740 | 5.8 | 1.830 | 9.5 |
| | | 44 | 8.520 | 9.220 | 12.7 | 9.340 | 1.9 | 9.600 | 6.1 | 10.210 | 15.9 |
| | | 68 | 12.620 | 13.550 | 10.8 | 13.810 | 2.7 | 14.190 | 6.7 | 15.040 | 15.6 |
| 140°C/10 MIN | res | | 1.540 | 1.680 | 9.7 | 1.680 | 0.0 | 1.670 | -0.6 | 1.700 | 1.3 |
| | | 44 | | | | | | | | | |
| | | 68 | 10.170 | 11.110 | 15.2 | 11.260 | 2.1 | 11.520 | 5.8 | 12.040 | 13.1 |
| 140°C/10 MIN | res | | 1.570 | 1.700 | 8.8 | 1.700 | 0.0 | 1.680 | -1.3 | 1.690 | -0.6 |
| | | 44 | 6.930 | 7.540 | 15.5 | 7.540 | 0.0 | 7.640 | 2.2 | 7.910 | 8.1 |
| | | 68 | 9.220 | 10.090 | 16.7 | 10.170 | 1.3 | 10.330 | 3.9 | 10.660 | 7.9 |
| 140°C/10 MIN | res | | 1.540 | 1.660 | 8.3 | 1.690 | 1.9 | 1.750 | 5.8 | 1.910 | 13.8 |
| | | 44 | 5.940 | 6.470 | 18.0 | 6.460 | -0.3 | 6.570 | 2.9 | 6.750 | 8.1 |
| | | 68 | 8.790 | 9.600 | 16.9 | 9.610 | 0.2 | 9.680 | 1.4 | 9.950 | 6.2 |
| 140°C/10 MIN | res | | 1.480 | 1.610 | 9.4 | 1.630 | 1.3 | 1.630 | 1.3 | 1.670 | 2.6 |
| | | 44 | 5.530 | 6.030 | 19.8 | 6.070 | 1.3 | 6.190 | 5.3 | 6.410 | 12.5 |
| | | 68 | 8.900 | 9.710 | 16.5 | 9.740 | 0.5 | 9.890 | 3.2 | 10.150 | 7.7 |
| 140°C/10 MIN | res | | 1.500 | 1.620 | 8.6 | 1.620 | 0.0 | 1.600 | -1.3 | 1.620 | 0.0 |
| | | 44 | 6.670 | 7.240 | 15.5 | 7.260 | 0.5 | 7.410 | 4.0 | 7.730 | 11.6 |

ELECTRICALLY CONDUCTIVE CEMENT

CROSS REFERENCE TO RELATED APPLICATIONS

This application is a continuation-in-part of Applicants' co-pending and commonly assigned U.S. patent application No. 07/436,199, filed Nov. 14, 1989 and entitled "Electrically Conductive Cement."

FIELD OF THE INVENTION

The present invention relates to electrically conductive cements or adhesives and, more particularly, to electrically conductive cements having superior long-term performance in high temperature and high humidity environments.

BACKGROUND OF THE INVENTION

Electrically conductive cements and adhesives are typically fabricated from single- or multi-component non-conductive carrier materials and conductive fillers such as metal or metallic particulate. While various cements can be used as the carrier, multi-component epoxies, single-component solvent-based systems, and combinations thereof have been used. Epoxies have a long shelf life, good bonding properties and can be cured with many materials. Similarly, single-component solvent-based systems can be readily cured by driving off the solvent to form a strong and reliable bond with many materials. The fillers are typically noble metals, such as gold or silver, in various particulate sizes. A preferred filler is a mixture of flake-like and non-flake particles of various sizes. The particles can be essentially solid or, in some cases, metal-plated non-conductive bodies. In a typical formulation, the conductive filler can comprise approximately 75% by weight, or more, of the total material with the carrier comprising the remaining material. It has been thought that metal or metal-plated particles in the form of flakes or platelets provide the bulk conductivity characteristics of such conductive cements because the flakes tend to align themselves in a continuous overlapping relationship in the cured carrier to provide an electron pathway. Non-flake conductive fillers in the carrier are thought to fill interstices between the flake particles providing enhanced conductivity.

Modern electric circuits may be fabricated as traditional rigid printed circuit boards (PCBs) using a subtractive process in which copper traces and connection pads form circuits which are etched from a copper foil layer attached to a rigid, non-conductive board or substrate. Electrical components are connected to such circuits by passing their usually solder-plated leads through mounting holes in the board and connecting the leads to connection pads by lead/tin soldering. It is also known to fabricate so-called 'flex circuits' in which copper traces and connection pads are formed on a flexible layer or substrate of, e.g., polyimide or polyester sheet, such as KAPTON TM polyimide in the 1 to 5 mil thickness range. Electronic components are connected to such circuits by passing their leads through mounting holes in the flexible layer and connecting the leads to connection pads by lead/tin soldering. More recently, surface-mount components (SMC) have been developed in which the component leads are merely positioned upon connection pads and soldered into place forming a butt joint. Surface-mount technology can be used with both rigid and flexible substrates.

Traditional soldered-connection systems represent highly developed technologies with proven performance under various temperature and humidity conditions, particularly higher-temperature and higher-humidity conditions. However, traditional soldered-connection systems often involve extensive chemical processing with various types of etchants and similar chemicals to fabricate a circuit on a substrate and may also require various fluxes and solvents to effect soldered connections. Additionally, traditional soldered-connection systems involve the application of a substantial amount of heat to momentarily melt the solder material to effect the connection. While rigid substrates and certain relatively high-cost polyimides are designed to accommodate the heat of soldering, flexible substrates that use the lower cost polymers such as polyesters are more susceptible to heat damage because of their relatively thin cross-section, low-heat capacity, and susceptibility to distortion. For example, soldered connections on a flexible polyester substrate can cause local 'puckering' of the substrate, changes in the center-to-center dimensions of the various connection pads, and warpage of the entire substrate.

Efforts have been made to use electrically conductive inks, cements, and adhesives to replace traditional soldered-connection systems in both rigid and flexible substrate applications. For example, electrically conductive ink circuits, including connection pads, have been printed on flexible polyester substrate and the conductive terminals of SMC devices then cemented to the connection pads with electrically conductive cement. Advantageously, the resulting flexible printed circuit can be easily configured to fit into a particular mounting envelope providing enhanced design flexibility. In addition, it is estimated that a successful solder-less-connection system utilizing conductive inks, cements, and low-cost flexible substrates could provide significant cost savings over traditional soldered-connection systems. The term 'conductive cement' as used herein means any composition or material used to establish electrical contact and a mechanical connection of separate bodies, e.g., a lead and a connection pad.

While conventional electrically conductive cements do not ordinarily possess the conductivity of solid metals and solder alloys, their conductivity (for example, 100 milli-ohm per cemented connection compared to 10 milli-ohm per soldered connection) is adequate for many electrical circuits. For example, a junction resistance of one ohm or so between a component lead and its connection pad will have little effect where the component is a resistor or other device having a resistance or impedance of several hundred or thousand ohms or greater. While junction resistance becomes more important in low-impedance circuit applications, a circuit can usually be designed to accommodate a wide range of cumulative junction resistances. In addition to the quantitive aspect of junction resistance, stability or small changes in junction resistance with time and environment is also an important aspect. A connection system that provides connections having a known resistance that is stable over time and under different environmental conditions is desirable because a connection system that does not provide the requisite stability would be unsuitable for many applications. In the context of a solderless connection system employing electrically conductive cement, any connection which on average exhibits less than about 20 to 25%, and preferably less than about 15% change in junction resistance after 1000 hours of exposure to 90% Relative Humidity (R.H.) at 60° C., is generally considered acceptable. The terms 'moisture resistant cement' and 'moisture resistant electrical contact' as used herein refer to a conductive cement that provides connections having stable junction resistance that on average does not change more than about 25%, under the test conditions described herein, i.e., after about 1000 hours exposure to 90% R.H., at 60° C.

One factor that affects the electrical conductivity at a junction interface is the presence or absence of non-conductive or resistive surface oxides that form as a consequence of exposure of the surfaces to be joined to ambient air and moisture. In soldered-connection systems, oxides are largely removed at the interfacial boundary between the solder-plated lead and the solder itself by fluxes that react with and effectively remove the oxides and which also serve to shield the junction interface from the ambient atmosphere and moisture as the solder cools. In conductive cement connection systems fluxes are not present during the curing process; and, therefore, it is desirable that the cement include means for reducing the adverse effects of surface oxides without the need to treat the surfaces to be connected, e.g., leaded electrical component leads, with aggressive cleaning agents or other treatments prior to effecting the connection.

While the initial bulk resistivity of known silver-based conductive cements is adequate, such cements are susceptible to increases in their resistivity at the interfacial boundary with a soldered-plated lead due to nonconductive lead/tin oxides. Thus the resistance across the junction between a conductive cement and a soldered-plated lead can vary considerably over time particularly with exposure to high humidity. The resistance of such connections is particularly sensitive to continued exposure to combinations of high humidity and high temperature. Since the above-described single- or double-component polymeric carriers used in conventional conductive cements are inherently permeable to moisture, the connections made with such cements are to some extent subject to the adverse effects of moisture. While a circuit can be designed to accommodate cumulative junction resistance, changes in that resistance with time can have a detrimental effect on the circuit's overall electrical performance. It is believed that moisture which permeates the carrier, in a connection formed with conductive cement, oxidizes metal at the interfacial boundary between the conductive cement and the component lead and the resultant nonconductive oxides tend to increase resistance.

Conductive cement compositions known in the art are typically comprised of polymeric carriers filled with conductive particles. For example, U.S. Pat. No. 4,880,570 describes a mixture of epoxy based adhesive, catalyst and conductive particles shaped to minimize steric interference and provide conductivity; U.S. Pat. No. 4,859,364 describes a mixture of organic medium filled with conductive particles of 0.3 to 1.0 micrometer and conductive metal coated particles of not more than 1 micrometer; U.S. Pat. No. 4,859,268 describes a mixture of photosensitive epoxy polymer, plasticizer and spherical electrically conductive particles; U.S. Pat. No. 4,814,040 describes an adhesive layer including conductive particles sized to penetrate a resistance layer and invade a metallic pattern by a thermal compressions process; U.S. Pat. No. 4,732,702 describes a mixture of resin filled with electroconductive metal powder or an inorganic insulating powder coated with electroconductive film; U.S. Pat. No. 4,716,081 describes a mixture of plastic, rubber or resin filled with silver-surfaced metal particles; U.S. Pat. No. 4,701,279 describes a mixture of thermoplastic elastomer filled with metal particles; U.S. Pat. No. 4,696,764 describes a mixture of resin filled with both abrasive and fine conductive particles; U.S. Pat. No. 4,624,801 describes a mixture of polyester urethane based polymer admixed with a blocked isocyanate and filled with conductive particles; U.S. Pat. No. 4,747,968 describes a mixture of epoxy resin, hardener and metallic silver particles; U.S. Pat. No. 4,564,563 describes a mixture of acrylic, carboxylated vinyl and epoxy polymer filled with metallic silver particles; and U.S. Pat. No. 4,566,990 describes a mixture of thermoplastic condensation polymer filled with both metal flake and conductive metal or metal coated fiber.

In general, conductive cements based on silver-filled polymeric systems perform well over a reasonably large temperature range but do not tend to perform well at the interfacial boundary between the cement and electrical leads under high humidity conditions. When aged under high humidity conditions, the resistance across the interfacial boundary is usually unstable, i.e., increases significantly. While many circuits can operate adequately with such increases in the resistivity in one or more of their connections, the humidity sensitivity is considered a factor limiting more widespread use of conductive cements in both rigid and flexible substrate applications.

SUMMARY OF THE INVENTION

In view of the foregoing, it is an object of the present invention to provide a conductive cement having improved performance characteristics, particularly under high humidity and/or temperature conditions and when used to connect high pin count, surface mount devices, and other electronic components which utilize ordinary metal finishes such as solder plate and tin plate, to a substrate.

It is another object of the present invention to provide a moisture resistant conductive cement in which the volumetric shrinkage of a carrier contributes to the formation of the electrical connection by enhancing particle-to-particle conduction and establishing a gastight surface contact between the filler particles and surfaces to be connected.

It is still another object of the present invention to provide an electrically conductive cement including conductive particles dispersed in a carrier and having surface characteristics and sized to assist in establishing gas-tight surface contact between the filler particles and surfaces to be connected due to volumetric shrinkage of the carrier upon curing.

The present invention provides an electrically conductive cement for adhering and establishing electrical contact between the adhered surfaces comprising a mixture of a filler dispersed in an adhesive carrier that shrinks upon curing, said carrier being provided in an amount effective to adhere said mixture to a substrate and said filler being comprised of electrically conductive particles in an amount and having a morphology effective to provide a moisture resistant electrical contact upon curing of the carrier.

The present invention also provides a method for making moisture resistant electrical connections, comprising the steps of applying to a surface a mixture of an adhesive carrier that shrinks upon curing and a filler comprised of electrically conductive particles in an amount and having a morphology effective to provide a moisture resistant electrical contact with the substrate.

The present invention provides an electrically conductive cement comprised of a curable polymeric carrier that volumetrically shrinks between its as applied uncured state and its cured state by an amount greater than about 6.8% and preferably between the ranges of about 7.5% and 65%; and a filler comprised of conductive particles effective to provide a moisture resistant electrical contact upon curing of the carrier.

While not wishing to be bound by any particular theory of invention or mode action it is believed that the use of a carrier or binder having a volumetric shrinkage characteristic between the uncured and cured states of greater than about 6.8% appears to effect a measure of a compaction to filler particles dispersed therein and provided in the proper amount and having the proper morphology to both cause the particles to be forced into enhanced electrical contact with each other and to form a gas-tight seal with the surfaces to be connected. It is believed that the shrinkage of the carrier during curing places the interior particles under compression with sufficient force to urge the particles into engagement with one another, as well as, to cause particles at the interface between the cement and surface to be connected, and to penetrate contaminants and non-conductive oxides that may be present on the surface. The particles are provided in an amount relative to the carrier and have morphology surface characteristics and body-size which, when subjected to the compressive forces resulting from the volumetric shrinkage of the carrier upon curing is effective to produce a gas-tight connection with the surface. Gas-tight connection with a lead surface is believed to be verified when a connection is mechanically pulled apart at the interfacial boundary to reveal conductive particles projecting from the cured cement surface. Moisture resistant electrical contact is believed to be the result of a gas-tight seal formed by the projecting particles pressing against the lead surface.

The carrier employed in the cements of this invention can be any material that can be filled with the conductive particles and shrinks sufficiently upon curing while providing adequate cohesive and adhesive strength to make a mechanically secure connection. The carrier may comprise a solvent-based polymeric system or form a mixture of two polymeric carriers, one having a high volumetric shrinkage characteristic and the other having a low volumetric shrinkage characteristic, with the weight percentage of the two components in the mixture being varied so as to provide a volumetric shrinkage characteristic of the mixture in the effective range.

In one embodiment of the present invention, the conductive filler particles are agglomerates having a diameter in a 10.6 micrometer to about 2.00 micrometer distribution range (with a mean size of about 4.5 micrometer) and having rough external appearance characterized by numerous recesses and ridge-like boundaries or salients and a length, width, and depth aspect ratio of approximately 1:1:1. The surface roughness characteristic of such agglomerates is believed to contribute to formation of the moisture resistant electrical contact and penetration of surface oxides or contaminants at a lead surface when the cement undergoes volumetric contraction during curing. Agglomerates are suitable electron carriers since their external surface characteristics can participate in forming moisture resistant electrical contacts between, for example, particles, the conductive leads of an electrical component, and a connection pad on a substrate. In alternative embodiments the moisture resistant electrical contact can be made with other particles called "surface penetrating particles" for purposes of this application including solid and metal-plated particles, that have characteristics similar to the above-described agglomerates, including size and rough surface characteristics.

In a preferred embodiment, the carrier comprises a mixture of two epoxy resins and some nonreactive diluent with a proportion of each component adjusted to provide a volumetric shrinkage between the uncured and cured carrier greater than about 6.8%, more preferably, about 7.5 to 65%.

If desired, a wetting agent may be provided in an amount effective to enhance the wetting ability of the uncured epoxy resin mixture during its application (typically less than 2-5% weight percent of the carrier).

In this preferred embodiment the conductive particle filler is an admixture of silver flakes, silver powder, and silver agglomerates. The agglomerates are irregularly shaped particles having multiple surface indentations and recesses that produce many rough-edged salients or ridges and have a particle length, width, and thickness aspect ratio of about 1:1:1. Silver and silver-plated particles are preferred because silver oxides are conductive in contrast to the insulating oxides of other materials; gold, palladium, and other noble metals also perform well under these conditions but provide an extreme price penalty. Nickel has demonstrated effective stability under high temperature and high humidity conditions, but exhibits higher initial resistance. In effective amounts the agglomerates appear to penetrate non-conducting oxides on surfaces to be connected, such as lead/tin coated leads, when establishing a cemented connection. In general, about 60 to 90 weight percent, preferably about 75 weight percent, of the epoxy resin mixture/conductive filler particle combination is filler particles.

The above and other objects and the further scope of applicability of the present invention will become apparent from the detailed description to follow, taken in conjunction with the accompanying drawings.

BRIEF DESCRIPTION OF THE DRAWINGS

FIG. 1 (Prior Art) is a table demonstrating the increase in junction resistance with exposure to 90% relative humidity conditions of a prior art formulation;

FIG. 3A is a table demonstrating the stability of the junction resistance upon exposure to 90% relative humidity conditions of a formulation prepared in accordance with Example II of the present invention in which the electrical leads were cleaned with acetone prior to effecting the connection;

FIG. 3B is another table demonstrating the stability of junction resistance upon exposure to 90% relative humidity conditions of the formulation of Example II of the present invention in which the electrical leads were cleaned with an inorganic acid prior to effecting the connection;

FIG. 4 is another table demonstrating the stability of junction resistance upon exposure to 90% relative humidity conditions of the formulation of Example III;

FIG. 5 is another table demonstrating the stability of junction resistance upon exposure to 90% relative humidity conditions of the formulation of Example IV;

FIG. 6 is another table demonstrating the improved junction resistance upon exposure to 90% relative humidity conditions of the formulation of Example V;

FIG. 7 is another table demonstrating the stability of junction resistance upon exposure to 90% relative humidity conditions of the formulation of Example VI;

FIG. 8 is another table demonstrating the stability of junction resistance upon exposure to 90% relative humidity conditions of the formulation of Example VII;

FIG. 9 is another table demonstrating the stability of junction resistance upon exposure to 90% relative humidity conditions of the formulation of Example VIII;

FIG. 10 is another table demonstrating the stability of junction resistance upon exposure to 90% relative humidity conditions of the formulation of Example IX; and FIG. 11 is another table demonstrating the stability of junction resistance upon exposure to 90% relative humidity conditions of the formulation of Example X.

DETAILED DESCRIPTION OF THE INVENTION

Figure 2:
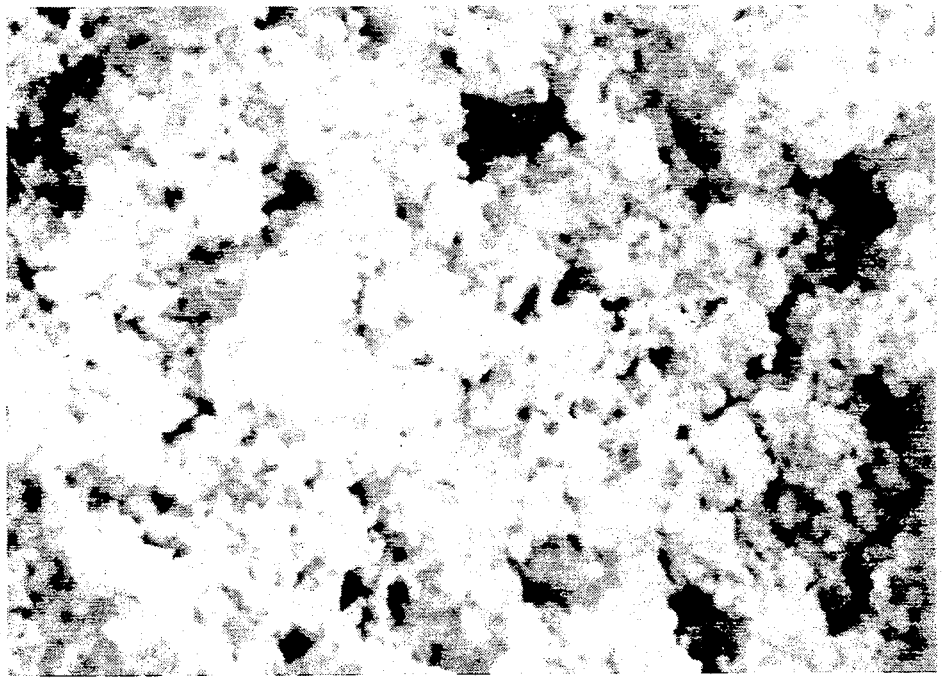
FIG. 2 is a photomicrograph of silver agglomerates utilized in the formulation of Example II at 5000X magnification and illustrating the many rough surface characteristics.

A number of factors must be considered in developing a conductive cement having improved performance characteristics under adverse operating conditions, particularly high humidity and temperature conditions. Since all polymeric carriers are moisture permeable to some extent the conductive particle filler must be such that formation of non-conductive oxidation products is minimal with continued exposure to humidity. Additionally, the carrier should have characteristics that enhance electrical conduction at the interfacial boundary between the cement and the surface of the electrical lead as well as conduction between the conductive particles of the filler; to this end, a silver particle or a silver-plated particle filler is preferred, although other noble metals and nickel are suitable as well.

The various formulations in accordance with the present invention presented below utilize fillers which are silver agglomerates, particles, flakes, and powders as well as silver-plated particles. The agglomerates are characterized by an irregular body-shape and a surface with many recesses that define projecting salients or ridges at the boundaries between the recesses. These agglomerates are preferably characterized as having a length, width, and thickness aspect ratio of approximately 1:1:1 and, as a consequence, are believed to function as force vectors which can form a gas-tight seal and pierce oxides present at a connection interface to maintain stable electrical contact even when subjected to elevated temperatures and humidities. The plated particles employed are in the form of non-conductive inorganic spheroids plated with silver as well as silver coated non-noble metals such as nickel. The agglomerates and the plated particles are believed to form the primary electron conduction path in the cured carrier by direct surface-to-surface inter-particle contact and to participate in contacting and penetrating the surface of the electrical lead surface to be connected, in response to the compaction that results from the volumetric shrinkage of the polymeric carrier. The smaller-sized silver particles, characterized herein as powders, assist in providing interstitial conduction paths between the larger-sized particles. The smaller powder particles, as in the case of the larger agglomerates or particles, can function singly or in groups, to penetrate any oxides or surface contaminants present at the interfacial surface between the cement and the component lead at the junction in response to the internal forces caused by volumetric shrinkage of the carrier.

While the agglomerates and powder particles having the described morphology in effective amounts and combined with the described carrier provide moisture resistant electrical contact, flake-like or platelet-like conductive particles have also been found useful. Flake-like particles are defined as particulates having a thickness dimension which is substantially (i.e., an order or magnitude) smaller than its length and width. In effective amounts, the flake-like particles tend to preferentially overlap or overlay one another in an aligned relationship enhancing the conductivity of the system.

The carrier possesses a volumetric shrinkage characteristic greater than about 6.8% in order to assure internal compaction of the conductive particle filler. Additional characteristics of the carrier can include good adhesion, wettability, and good handling. Since many conductive cements are applied by screen-printing, stencil or similar techniques, the uncured polymeric carrier should have a viscosity which provides a final conductive cement suitable for application by such processes. Carrier rheological properties should be effective for stenciling, screen printing, or pneumatic deposition processes commonly used for applying conductive cement. Suitable viscosities may range from 50,000 to 25,000 cps.

The following examples are representative formulations for conductive cements that provide moisture resistant electrical contacts.

Linear shrinkage values were determined by applying a line of the uncured adhesive to a flat surface, curing the adhesive, and determining shrinkage as a function of the uncured and cured line lengths. Volumetric shrinkage characteristics between the uncured and the cured cement were determined by the following protocol:

The density $\rho_u$ of the uncured (carrier) epoxy solution was determined at room temperature by determining the weight W of an epoxy-filled container of known volume V and known empty weight w as follows:

$$\rho_u = (W-w)/V \qquad \text{Eq. 1}$$

The density $\rho_c$ of the cured epoxy was determined in accordance with the Archimedean principle (ASTM C693) at room temperature using METTLER density determination kit E-210250 and an OHAUS precision balance 160D. The dry weight A of the cured epoxy specimen in air is determined and its weight P in a liquid of known density $\rho_l$ is determined and the density $\rho_c$ of the cured epoxy is determined as follows:

$$\rho_c = (A/P)\rho_l \qquad \text{Eq. 2}$$

The volumetric shrinkage Vs of the uncured and cured epoxies is determined by determining the volumes of the uncured and cured epoxy using the density values $\rho_u$ and $\rho_c$ obtained above. The volume of the uncured epoxy $V_u$ is determined by measuring the weight W of a specimen of the uncured epoxy and determining its volume as follows:

$$V_u = W_u \rho_u \qquad \text{Eq. 3}$$

The epoxy is then cured in accordance with the cure schedule presented below and the weight $W_c$ of the now-cured specimen is determined. The volume of the cured epoxy $V_c$ is determined as follows:

$$V_c = W_c \rho_c \qquad \text{Eq. 4}$$

The volumetric shrinkage Vs in per cent is then determined as follows:

$$V_s = [(V_u - V_c)/V_u](100) \qquad \text{Eq. 5}$$

EXAMPLE I

As a representative example of the change in junction resistance under 90% relative humidity conditions, a conductive cement manufactured by Emerson & Cuming of Lexington, Mass. and sold under the AMICON TM CSM-933-65-1 designation, was used to connect a 68-pin surface-mount device (SMD), two 44-pin surface-mount devices, and a ten resistor series string in a test circuit and subjected to a 140° C. cure for a period of 10 minutes consistent with the manufacturer's instructions. The pins of the various surface-mount devices were series-connected through resistive elements within the surface-mount devices and the total junction resistance determined by subtracting the cumulative series resistance of the intra-device components from the total measured resistance. In a similar manner, the resistance measurement for the resistor-string was effected by subtracting the cumulative values of the resistors that comprised the string from the total series resistance to arrive at a cumulative junction resistance value. The resistance of the intra-device elements of the surface-mount devices as well as the resistors within the resistor string was stable within the temperature and humidity range of the tests as verified by control circuits. The initial junction resistance in ohms was measured at room temperature and at test conditions of 60° C. and 90% relative humidity as shown in FIG. 1. The resistance was then again measured after 15.5, 24, 39 and 63 hours exposure at the 60° C. and 90% relative humidity test conditions. As shown in FIG. 1, the ohmic resistance of all junctions increased with time at 90% relative humidity with an extrapolated value for 1000-hours indicating a substantial increase for the 68-pin devices and the two 44-pin devices and less of an increase for the resistor-string.

As can be appreciated from a consideration of the data in FIG. 1, a known conductive cement junction undergoes a substantial increase in resistance over time at elevated relative humidity.

EXAMPLE II

A conductive cement is prepared using a conductive filler including three types of silver particulate A, B, and C. Particulate A is a silver flake having a Fisher Sub-Sieve Size (FSSS) in the range of 0.90–1.30 micrometer, a tap density (by Tap-Pak Volumeter) of 3.0 to 3.5 g/cc, a Scott apparent density of 30–35 g/in$^3$, a surface area of 0.3–0.6 m$^2$/g and a size distribution of 90%<14.00 micrometer, 50%<7.00 micrometer, and 10%<2.00 micrometer. The size distribution data presented herein were determined with a Leeds and Northrop Microtrac. A suitable particulate A is "Silver Flake #53" available from the Electronic Materials Division of the Metz Metallurgical Corporation, South Plainfield, N.J.

Particulate B is silver agglomerate having a Fisher sub-sieve size (FSSS) of 0.6 micrometers, a tap density (by Tap-Pak Volumeter) of 1.85 g/cc, a Scott apparent density of 16.7 g/in$^3$, a surface area of 1.62m$^2$/g and a size distribution of 100%<10.6 micrometers, 90%<8.10 micrometers, 50%<4.4 micrometers, and 10%<1.40 micrometers with a mean size of 4.5 micrometers. A suitable particulate B is "Silver Powder SPS-100" available from Metz Metallurgical Corporation. This silver agglomerate as shown in the photomicrograph of FIG. 2, has many rough surface features.

Particulate C is silver powder having a Fisher Sub-Sieve Size (FSSS) of 0.70 microns, a tap density (by Tap-Pak Volumeter) of 2.75 g/cc, a Scott apparent density of 17.5 g/in$^3$, and a surface area of 1.84 m$^2$/g and a size distribution of 100%<5.27 micrometer, 90%<3.16 micrometer, 50%<1.25 micrometer, and 10%<0.51 micrometer. A suitable particulate C is "Fine Silver Powder S-ED" available from Metz Metallurgical Corporation.

Particulates A, B, and C are mixed in a weight ratio of about 40%, 30%, and 30% to constitute the metallic silver filler that is admixed with the carrier.

The carrier comprises a polymer mixture of two epoxy resins, Epoxy A and Epoxy B. Epoxy A is a bisphenol F epoxy resin such as "Aratronic 5046", a bisphenol F diglycidyl ether, having a relatively low viscosity of 1400 cps at 25° C., available from the Ciba-Geigy Corporation. Epoxy B is a liquid phenol epoxy novolac resin, such as "Quatrex 2010", a phenol epoxy novolac resin having a relatively high viscosity of 25,000–45,000 cps at 25° C., available from Dow Chemical Corporation, Midland, Mich.

The polymeric carrier may also include a conventional hardener such as an imidazole, for instance, N-(2-cyanoethyl)-2-ethyl,4-methylimidazole, available from PolyOrganix Corporation of Newburyport, Mass. under the CURIMID TM -CN designation.

The polymeric carrier can also include a coupling or wetting agent to provide enhanced wetting of the uncured material. A representative coupling agent is gamma-glycidoxypropyltrimethoxysilane, available from the Union Carbide Company under the "A-187" designation. Yet another adjuvant includable in the polymeric carrier of the present invention is gamma-butyrolactone, available from the Aldrich Chemical Co., Milwaukee, Wis., which material functions as a diluent to adjust viscosity.

A conductive cement composition having the following formulation was prepared:

| Component | Batch Quantity - % weight (normalized weight units) |
|---|---|
| Epoxy A | 8.275 |
| Epoxy B | 8.275 |
| Hardener | 3.973 |
| Diluent | 1.985 |
| Coupling Agt | 0.993 |
| total epoxy wt = | 23.5% |
| Particle A | 30.600 |
| Particle B | 22.950 |
| Particle C | 22.950 |
| total silver wt = | 76.5% |

The 76.5% silver content represents a preferred value for common application techniques such as application by stencil, screen print, tampo print, syringe, etc. Below 74% this conductive cement composition can exhibit electrical instability with resistance increasing by an order of magnitude under various test conditions. Above 78% this conductive cement composition is too viscous for use in stencil and screen printing applications, although still suitable for application by syringe.

The above polymeric carrier was determined to have a volumetric shrinkage 17%. In a first experiment, electrical leads were initially cleaned with acetone and the above formulation used to connect a 68-pin surface-mount device (SMD), a 44-pin surface-mount device, and a series-connected resistor string in each of six test circuits (Trials 1-6) as described in Example I. The junction resistance was measured at room temperature and at test conditions of 60° C. and 90% relative humidity as shown in FIG. 3A. The resistivity was then again measured after 17, 40, 112, 306, 618, and 1002 hours exposure at the 60° C. and 90% relative humidity test conditions. As shown by the % increment columns in FIG. 3A, the ohmic resistance of all junctions varied minimally after 1002 hours at 90% relative humidity with only one set of junctions having an increase in resistance over 11%.

In a second experiment, the electrical leads of the above-described devices were first cleaned with an inorganic acid and the connections made with the formulation of this Example in the manner described above. The junction resistance was measured at room temperature and at test conditions of 60° C. and 90% relative humidity as shown in FIG. 3B. The resistivity was then measured after 14.5, 117.5, 149, 297, and 969 hours exposure at the 60° C. and 90% relative humidity test conditions. As shown by the % increment columns in FIG. 3B, the ohmic resistance of all junctions varied minimally after 969 hours at 90% relative humidity with only one set of junctions having an increase in resistance over 12%.

EXAMPLE III

A conductive cement is prepared using a conductive particle filler of three types of silver particulates A,B, and C. Particulates A, B, and C are those described above in Example II and are similarly mixed in a weight ratio of 40%, 30%, and 30% to constitute a filler that is admixed with a carrier.

The carrier comprises a single epoxy resin. The epoxy is a liquid bisphenol A epoxy resin such as "Quantrex 1010", viscosity of 11,000–14,000 cps at 25° C., available from the Dow Chemical Corporation.

The polymeric carrier can also include a hardener (N-(2-cyanoethyl)-2-ethyl,4-methylimidazole), gamma-glycidoxypropyltrimethoxysilane and a diluent gamma-butyrolactone.

A conductive cement was prepared with the following formulation:

| Component | Batch Quantity - % weight (normalized weight units) |
|---|---|
| Epoxy | 16.55 |
| Hardener | 3.97 |
| Coupling Agent | 0.99 |
| Diluent | 1.99 |
| total epoxy wt = | 23.50% |
| Particle A | 30.600 |
| Particle B | 22.950 |
| Particle C | 22.950 |
| total silver wt = | 76.5% |

The above polymeric carrier was determined to have a volumetric shrinkage of 13% and was used to connect a 68-pin surface-mount device (SMD), a 44-pin surface-mount device, and a series-connected resistor string in each of two test circuits (Trials 1-2) as described in Example I. The junction resistance was measured at room temperature and at test conditions of 60° C. and 90% relative humidity as shown in FIG. 4. The resistivity was then again measured after 15, 65, and 141 hours exposure at the 60° C. and 90% relative humidity test conditions. As shown by the % increment columns in FIG. 4, the ohmic resistance of all junctions varied minimally after 141 hours at 90% relative humidity with two (2) sets of junctions having an increase in resistance over 2%.

EXAMPLE IV

A conductive cement is prepared using a conductive particle filler of two types of silver particulates A and C which are identical to particulates A and C described above for Example II.

Particulates A and C are desirably mixed in a weight ratio of 40% and 60% to constitute the filler that is admixed with the carrier.

The carrier comprises a mixture of two epoxy resins, Epoxy A and Epoxy B. Epoxy A is a bisphenol F epoxy resin such as "Aratronic 5046". Epoxy B is a liquid phenol epoxy novolac resin, such as "Quatrex 2010".

The polymeric carrier can also include a hardener (N-(2-cyanoethyl)-2-ethyl,4-methylimidazole) a coupling agent (gamma-glycidoxypropyltrimethoxysilane) and a diluent (gamma-butyrolactone).

A conductive cement was prepared with the following formulation:

| Component | Batch Quantity - % weight (normalized weight units) |
|---|---|
| Epoxy A | 8.21 |
| Epoxy B | 8.21 |
| Hardener | 3.94 |
| Diluent | 0.66 |
| Coupling Agent | 0.99 |
| total epoxy wt = | 22.0% |
| Particle A | 31.20 |
| Particle C | 46.80 |
| total silver wt = | 78.0% |

The above polymeric carrier was determined to have a volumetric shrinkage of 10% and was used to connect a 68-pin surface-mount device (SMD), a 44-pin surface-mount device, and a series-connected resistor string in each of six test circuits (Trials 1-6) as described in Example I. The junction resistance was measured at room temperature and at test conditions of 60° C. and 90% relative humidity as shown in FIG. 5. The resistivity was then again measured after 62, 136, 1073, and 1598 hours exposure at the 60° C. and 90% relative humidity test conditions. As shown by the % increment columns in FIG. 5, the ohmic resistance of all junctions varied minimally after 1598 hours at 90% relative humidity with only one set of junctions having an increase in resistance over 19%.

EXAMPLE V

A conductive cement is prepared using a conductive filler of three types of silver particulates A, B, and C which are identical to particulates A, B, and C described above for Example II. Particulates A, B, and C are desirably mixed in a weight ratio of 40%, 30%, and 30% to constitute the filler that is mixed with a carrier. The carrier comprises a single epoxy/solvent combination. The epoxy is a bisphenol A epoxy resin such as 'EPONOL (R) 53-BH-35', a high molecular weight epoxyavailable from the Shell Chemical Company, Houston, Tex. In the form provided by the manufacturer, the epoxy resin represents about 35% of the as-supplied material with the remainder comprising a solvent of about 75% methyl ethyl ketone (MEK) and 25% propylene glycol methylether (PGME). Prior to use in formulating the conductive cement of Example V, the MEK and PGME are removed and replaced with 2-butoxyethyl acetate available, for example, from the Aldrich Chemical Co.

A conductive cement composition in accordance with the present invention was prepared and has the following formulation:

| Component | Batch Quantity - % weight (normalized weight units) |
| --- | --- |
| Epoxy | 12.921 |
| Solvent | 23.996 |
| total epoxy wt = | 36.917% |
| Particle A | 25.233 |
| Particle B | 18.925 |
| Particle C | 18.925 |
| total silver wt = | 63.083% |

The above polymeric carrier was determined to have a volumetric shrinkage of 65% and was used to connect a 68-pin surface-mount device (SMD), a 44-pin surface-mount device, and a series-connected resistor string in each of six test circuits (Trials 1-6) as descried in Example I. The junction resistance was measured at room temperature and at test conditions of 60° C. and 90% relative humidity as shown in FIG. 6. The resistivity was then measured after 6, 13, 349, and 1530 hours exposure at the 60° C. and 90% relative humidity test conditions. As shown by the % increment columns in FIG. 6, the ohmic resistance of all junctions varied minimally after 1530 hours at 90% relative humidity with only one set of junctions having an increase in resistance over 10%.

EXAMPLE VI

A conductive cement is prepared using a conductive particle filler of three types of silver particulates A, B, and C which are identical to particulates A, B, and C described above for Example II. Particulates A, B, and C are desirably mixed in a weight ratio of 40%, 30%, and 30% to constitute a filler that is mixed with a carrier.

The carrier comprises a single epoxy/solvent combination. The epoxy is a novolac epoxy resin such as "Quatrex 2010", a phenol epoxy novolac resin having a relatively high viscosity of 25,000-45,000 cps at 25° C. available from Dow Chemical Corporation. The solvent 2-(2-ethoxyethoxy) ethyl acetate is available under the tradename "Carbitol" acetate from the Eastman Kodak Co., Rochester, N.Y. and is also known as diethylene glycol monoethyl ether acetate. The polymeric carrier can also include a hardener (N-(2-cyanoethyl)-2-ethyl,4-methylimidazole) and a coupling agent (gamma-glycidoxypropyltrimethoxysilane).

A conductive cement was prepared with the following formulation:

| Component | Batch Quantity - % weight (normalized weight units) |
| --- | --- |
| Epoxy | 14.79 |
| Solvent | 6.34 |
| Hardener | 1.18 |
| Coupling Agent | 0.89 |
| total epoxy wt = | 23.20% |
| Particle A | 30.72 |
| Particle B | 23.04 |
| Particle C | 23.04 |
| total silver wt = | 76.80% |

The above polymeric carrier was determined to have a volumetric shrinkage of 25% and was used to connect a 68-pin surface-mount device (SMD), a 44-pin surface-mount device, and a series-connected resistor string in each of six test circuits (Trials 1-6) as described in Example I. The junction resistance was measured at room temperature and at test conditions of 60° C. and 90% relative humidity as shown in FIG. 7. The resistivity was then again measured after 14, 62, and 1025 hours exposure at 60° C. and 90% relative humidity test conditions. As shown by the % increment columns in FIG. 7, the ohmic resistance of all junctions varied minimally after 1025 hours at 90% relative humidity.

EXAMPLE VII

A conductive cement is prepared using a conductive particle filler of three types of silver particulates A, B, and C which are identical to particulates A, B, and C described above for Example II. Particulates A, B, and C are desirably mixed in a weight ratio of 40%, 30%, and 30% to constitute the metallic silver filler that is admixed with a carrier.

The carrier comprises a mixture of two epoxy resins, Epoxy A and Epoxy B. Epoxy A is a bisphenol A epoxy resin such as "Eponol 53" described above and Epoxy B is a liquid phenol Epoxy novolac resin, such as "Quatrex 1010", also described above.

The polymeric carrier can also include hardeners I and II. Hardener I is a polyoxypropylenediamine available under the Jeffamine D-230 designation from the Texaco Chemical Company, and hardener II is a triethyleneglycoldiamine available under the Jeffamine EDR 148 designation, also from the Texaco Chemical Company.

The polymeric carrier may include an accelerator to promote curing. A suitable accelerator such as a mixture of aliphatic amines is available from the Texaco Chemical Company under the '399' designation. The polymeric carrier may also include an adhesion promoter such as a glyceryl poly(oxypropylene) triamine available under the Jeffamine T-5000 designation from the Texaco Chemical Company.

A conductive cement composition was prepared with the following formulation:

| Component | Batch Quantity - % weight (normalized weight units) |
| --- | --- |
| Epoxy A | 13.50 |
| Epoxy B | 8.94 |

-continued

| Component | Batch Quantity - % weight (normalized weight units) |
| --- | --- |
| Hardener I | 2.59 |
| Hardener II | 0.36 |
| Accelerator | 0.27 |
| Adhesion Promoter | 1.34 |
| total epoxy wt = | 27.00% |
| Particle A | 29.20 |
| Particle B | 21.90 |
| Particle C | 21.90 |
| total silver wt = | 73.00% |

The above polymeric carrier was determined to have a volumetric shrinkage of 19% and was used to connect a 68-pin surface-mount device (SMD), a 44-pin surface-mount device, and a series-connected resistor string in each of six test circuits (Trials 1-6) as described in Example I. The junction resistance was measured at room temperature and at test conditions of 60° C. and 90% relative humidity as shown in FIG. 8. The resistivity was then again measured after 15, 191, and 981 hours exposure at the 60° C. and 90% relative humidity test conditions. As shown by the % increment columns in FIG. 8, the ohmic resistance of all junctions varied minimally after 1598 hours at 90% relative humidity with only one set of junctions having an increase in resistance over 8%.

EXAMPLE VIII

A conductive cement is prepared using a conductive particle filler of two types of conductive particles, particulates A and D. Particulate A is identical to particulate A described above for Example I. Particulate D comprises silver-coated nickel particles having a mean particle dimension of 28u with an actual size distribution of 90%<48.19u, 50%<27.97u, and 10%<12.36u. A suitable particulate D is available from Novamet Specialty Products Corp., an INCO Company, 681 Lawlins Road, Wyckof, N.J. 07481 (201-891-7976).

Particulates A and D are desirably mixed in a weight ratio of 80% and 20% to constitute a filler that is admixed with a carrier.

The carrier comprises a mixture of two epoxy resins, Epoxy A and Epoxy B. Epoxy A is a bisphenol F epoxy resin such as "Aratronic 5046" and Epoxy B is a liquid phenol epoxy novolac resin, such as "Quatrex 2010".

The polymeric carrier can also include a hardener (N-(2-cyanoethyl)-2-ethyl,4-methylimidazole) and a coupling agent (gamma-glycidoxypropyltrimethoxysilane).

A conductive cement composition was prepared with the following formulation:

| Component | Batch Quantity - % weight (normalized weight units) |
| --- | --- |
| Epoxy A | 7.50 |
| Epoxy B | 7.50 |
| Hardener | 3.60 |
| Coupling Agent | 0.90 |
| total epoxy wt = | 19.5% |
| Particle A | 64.40 |
| Particle D | 16.10 |
| total silver wt = | 80.5% |

The above polymeric carrier formulation was determined to have a volumetric shrinkage of 7.6% and was used to connect a 68-pin surface-mount device (SMD), a 44-pin surface-mount device, and a series-connected resistor string in each of six test circuits (Trials 1-6) as described in Example I. The junction resistance was measured at room temperature and at test conditions of 60° C. and 90% relative humidity as shown in FIG. 9. The resistivity was then again measured after 119, 503, and 1146 hours exposure at the 60° C. and 90% relative humidity test conditions. As shown by the % increment columns in FIG. 9, the ohmic resistance of all junctions varied minimally after 1146 hours at 90% relative humidity with only one set of junctions having an increase in resistance over 15%.

EXAMPLE IX

A conductive cement is prepared using a conductive particle filler of two types of conductive particles, particulates A and E, of which particulate A is identical to particulate A described above for Example I. Particulates E are silver-coated nickel particles of about 32 % wt. silver having a Scott apparent density of 3.66 g/in$^3$, a surface area of 0.22 m$^2$/g, a powder resistivity of 0.4 m ohm.cm, and a mean particle dimension of 21u with an actual size distribution of 90%<29.3 micrometer, 50%<19.5 micrometer, and 10%<13.9 micrometer. A suitable particulate E is available from Potter Industries, Inc., Carlstadt, N.J. under the Conducto-O-Fil Silver Nickel designation.

Particulates A and E are desirably mixed in a weight ratio of 80% and 20% to constitute a filler that is admixed with a carrier.

The carrier comprises principally a mixture of two epoxy resins, Epoxy A and Epoxy B. Epoxy A is a bisphenol F epoxy resin such as "Aratronic 5046" and Epoxy B is a liquid phenol epoxy novolac resin, such as "Quatrex 2010".

The polymeric carrier can also include a hardener (N-(2-cyanoethyl)-2-ethyl,4-methylimidazole) and a coupling agent (gamma-glycidoxypropyltrimethoxysilane).

A conductive cement was prepared with the following formulation:

| Component | Batch Quantity - % weight (normalized weight units) |
| --- | --- |
| Epoxy A | 7.50 |
| Epoxy B | 7.50 |
| Hardener | 3.60 |
| Coupling Agent | 0.90 |
| total epoxy wt = | 19.5% |
| Particle A | 64.40 |
| Particle E | 16.10 |
| total silver wt = | 80.5% |

The above polymeric carrier was determined to have a volumetric shrinkage characteristic of 7.6% and was used to connect a 68-pin surface-mount device (SMD), a 44-pin surface-mount device, and a series-connected resistor string in each of six test circuits (Trials 1-6) as described in Example I. The junction resistance was measured at room temperature and at test conditions of 60° C. and 90% relative humidity as shown in FIG. 10. The resistivity was then again measured after 65, 453, 1096 hours exposure at the 60° C. and 90% relative humidity test conditions. As shown by the % increment columns in FIG. 10, the ohmic resistance of all junctions varied minimally after 1096 hours at 90% relative humidity with only one set of junctions having an increase in resistance over 14%.

EXAMPLE X

A conductive cement is prepared using a conductive particle filler of two types of conductive particles, particulates A and F, of which particulate A is identical to particulate A described above for Example I. Particulates F are silver-coated glass spheres of about 23.8% silver having a Scott apparent density of 0.81 g/in$^3$, a powder resistivity of 2.63 milli-ohm cm, and a mean particle dimension of 13 micrometers with an actual size distribution of 90%<20.0 micrometer, 50%<12.1 micrometer, and 10%<7.1 micrometer. A suitable particulate F is available from Potter Industries, Inc., Carlstadt, N.J. 07072 under the Conducto-O-Fil. Silvered Glass Spheres designation. Particulates A and F are desirably mixed in a weight ratio of 92% and 8% to constitute a filler that is admixed with a carrier.

The carrier comprises principally a mixture of two epoxy resins, Epoxy A and Epoxy B. Epoxy A is a bisphenol F epoxy resin such as "Aratronic 5046" and Epoxy B is a liquid phenol epoxy novolac resin, such as "Quatrex 2010".

The polymeric carrier can also include a conventional hardener (N-(2-cyanoethyl)-2-ethyl,4-methylimidazole) and a coupling agent (gamma-glycidoxypropyltrimethoxysilane).

A conductive cement was prepared with the following formulation:

| Component | Batch Quantity - % weight (normalized weight units) |
|---|---|
| Epoxy A | 7.88 |
| Epoxy B | 7.88 |
| Hardener | 3.78 |
| Coupling Agent | .96 |
| total epoxy wt = | 20.5% |
| Particle A | 73.14 |
| Particle F | 6.36 |
| total silver wt = | 79.5% |

The above polymeric carrier was determined to have a volumetric shrinkage characteristic of 7.6% and was used to connect a 68-pin surface-mount device (SMD), a 44-pin surface-mount device, and a series-connected resistor string in each of six test circuits (Trials 1-6) as described in Example I. The junction resistance was measured at room temperature and at test conditions of 60° C. and 90% relative humidity as shown in FIG. 11. The resistivity was then again measured after 65, 453, and 1096 hours exposure at the 60° C. and 90% relative humidity test conditions. As shown by the % increment columns in FIG. 11, the ohmic resistance of all junctions varied minimally after 1096 hours at 90% relative humidity with only two (2) sets of junctions having an increase in resistance over 15%.

In some of the test runs of Examples II to X, (results not presented), the high humidity caused pooling of hot liquid water and through-corrosion of the electrical leads outside the cemented junction, resulting in invalid test results.

The present invention advantageously provides an electrically conductive cement composition having substantially stable conductivity and resistance characteristics under high humidity conditions and is believed to achieve this result as a consequence of providing a cement having a volumetric shrinkage rate in a range that assures particle-to-particle contact and particle-to-connection surface contact to produce a reliable connection.

As will be apparent to those skilled in the art, various changes and modifications may be made to the illustrated electrically conductive cement of the present invention without departing from the spirit and scope of the invention as determined in the appended claims and their legal equivalent.

What is claimed is:

1. An electrically conductive cement for adhering and establishing electrical contact between adhered surfaces, comprising:
   a mixture comprised of filler particles dispersed in a shrinkable adhesive polymeric carrier, said filler being comprised of electrically conductive particles comprising, in combination, conductive flake particles having a thickness which is an order of magnitude smaller than their length and width and at least one member selected from the group consisting of:
   (a) conductive agglomerates having a rough surface characteristic;
   (b) silver-coated nickel particles;
   (c) silver-coated glass spheres; and
   (d) fine silver particles;
   wherein said filler is provided in an amount effective to provide a moisture resistant electrical contact upon curing of said carrier, and
   said carrier shrinks at least about 6.8% volumetrically upon curing; and wherein said filler is present in about 60-90 weight percent based on the combined weight of the carrier and the filler.

2. The cement of claim 1, wherein said carrier shrinks about 7.5% to about 65% volumetrically.

3. The cement of claim 2, wherein said flake conductive particles have an FSSS of about 0.90 to 1.30 micrometers, a tap density of about 3.0 to 3.5 g/cc, a Scott apparent density of about 30 to 35 g/in$^3$ and a surface area of about 0.3 to 0.6 m$^2$/g.

4. The cement of claim 2, wherein the cement includes agglomerate conductive particles having a size distribution of about 1.40 micrometers to about 10.6 micrometers with a mean size of about 4.5 micrometers.

5. The cement of claim 4, wherein said agglomerate conductive particles have a FSSS of about 0.6 micrometers, a tap density of about 1.85 g/cc, A Scott apparent density of about 16.7 g/in$^3$ and surface area of about 1.62 m$^2$/g.

6. The cement of claim 4, wherein the cement includes fine silver particles having an FSSS of about 0.70 micrometers, a tap density of about 2.75 g/cc, a Scott density of about 17.5 g/in$^3$ and a surface area of about 1.84 m$^2$/g.

7. The cement of claim 4, wherein the cement includes agglomerate conductive particles having a means size of about 4.5 micrometers and a length, width, and depth aspect ratio of approximately 1:1:1.

8. The cement of claim 6, wherein said filler comprises about 78% wt of the cement, and said filler is a mixture of said flakes and said agglomerates in a respective weight ratio of about 40% and 60%.

9. The cement of claim 8, wherein said carrier shrinks at least about 10% and not more than about 65% volumetrically.

10. The cement of claim 6, wherein the cement includes agglomerate conductive particles having a size distribution of about 1.40 micrometers to about 10.6 micrometers, a mean size of about 4.5 micrometers, an FSSS of about 0.6 micrometers, a tap density of about 1.85 g/cc, a Scott apparent density of about 16.7 g/in$^3$ and surface area of about 1.62 m$^2$/g.

11. The cement of claim 10, wherein said filler comprises about 63.1% to about 76.8% wt of the cement, and said filler is a mixture of said flakes, said agglomerates, and said fine silver particles in a respective weight ratio of about 40%, 30% and 30%.

12. The cement of claim 11, wherein said carrier shrinks between about 13% and about 65% volumetrically.

13. The composition of claim 1, wherein said silver-coated nickel particles have a mean particle dimension of about 28 micrometer.

14. The cement of claim 1, wherein said silver-coated nickel particles contain about 32% wt silver and have a Scott Density of about 3.66 g/in$^3$, a surface area of about 0.22 m$^2$/g, a power resistivity of about 0.4 m ohm.cm, and a mean particle dimension of about 21 micrometer.

15. The cement of claim 1, wherein said silver-coated glass spheres contain about 23.82% wt silver and have a Scott Density of about 0.81 g/in$^3$, a powder resistivity of about 2.63 m ohm.cm, and a mean particle dimension of about 13 micrometer.

16. The cement of claim 13, wherein said filler comprises about 80.5% wt of the cement, and said filler is a mixture of said flakes and said silver-coated nickel particles in a respective weight ratio of 80% and 20%.

17. The cement of claim 16, wherein said carrier shrinks at least about 7.6% and not more than about 65% volumetrically.

18. The cement of claim 14, wherein said filler comprises about 80.5% wt of the cement, and said filler is a mixture of said flakes and said silver-coated nickel particles in a respective weight ratio of 80% and 20%.

19. The cement of claim 18, wherein said carrier shrinks at least about 7.6% and not more than about 65% volumetrically.

20. The cement of claim 15, wherein said filler comprises about 79.5% wt of the cement, and said filler is a mixture of said flakes and said silver-coated glass spheres in a respective weight ratio of 92% and 8%.

21. The cement of claim 20, wherein said carrier shrinks at least about 7.6% and not more than about 65% volumetrically.

* * * * *